US010018525B2

(12) United States Patent
Celik-Butler et al.

(10) Patent No.: US 10,018,525 B2
(45) Date of Patent: Jul. 10, 2018

(54) SELF-POWERED TACTILE PRESSURE SENSORS

(71) Applicant: Board of Regents, The University of Texas System, Austin, TX (US)

(72) Inventors: Zeynep Celik-Butler, Colleyville, TX (US); Donald P. Butler, Colleyville, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 137 days.

(21) Appl. No.: 15/032,435

(22) PCT Filed: Oct. 30, 2014

(86) PCT No.: PCT/US2014/063201
§ 371 (c)(1),
(2) Date: Apr. 27, 2016

(87) PCT Pub. No.: WO2015/066350
PCT Pub. Date: May 7, 2015

(65) Prior Publication Data
US 2016/0258829 A1    Sep. 8, 2016

Related U.S. Application Data

(60) Provisional application No. 61/898,953, filed on Nov. 1, 2013.

(51) Int. Cl.
*G01L 1/16* (2006.01)
*G01L 9/00* (2006.01)
(Continued)

(52) U.S. Cl.
CPC .............. *G01L 9/0055* (2013.01); *G01L 1/16* (2013.01); *G01L 5/226* (2013.01); *G01L 9/008* (2013.01);
(Continued)

(58) Field of Classification Search
CPC ... G01L 1/16; G01L 5/22; G01L 5/226; G01L 9/00; G01L 9/0055; G01L 9/008;
(Continued)

(56) References Cited

U.S. PATENT DOCUMENTS

2008/0129278 A1 *   6/2008  Dai ........................ G01D 5/142
                                                               324/109
2009/0179523 A1 *   7/2009  Wang ...................... B82Y 10/00
                                                               310/338
(Continued)

FOREIGN PATENT DOCUMENTS

JP              2007309658 A    *  11/2007   ............... G01L 5/00

OTHER PUBLICATIONS

Polla, et al., Integrated Zinc Oxide on-silicon tactile sensor array, Proc. Int. Elect. Devices Meeting, pp. 133-136, 1985.
(Continued)

*Primary Examiner* — Nguyen Ha
(74) *Attorney, Agent, or Firm* — Thomas | Horstemeyer, LLP (57) ABSTRACT

In one embodiment, a self-powered tactile pressure sensor includes a flexible substrate, an array of piezoelectric crystalline nanorods each having a bottom end and a top end, the nanorods being generally perpendicular to the substrate, a top electrode that is electrically coupled to the top ends of the nanorods, and a bottom electrode that is electrically coupled to the bottom ends of the nanorods.

17 Claims, 11 Drawing Sheets

(51) Int. Cl.
*G01L 9/06* (2006.01)
*H01L 41/04* (2006.01)
*H01L 41/22* (2013.01)
*H01L 41/113* (2006.01)
*H01L 41/37* (2013.01)
*H01L 41/18* (2006.01)
*G01L 5/22* (2006.01)

(52) U.S. Cl.
CPC .......... *H01L 41/04* (2013.01); *H01L 41/1132* (2013.01); *H01L 41/183* (2013.01); *H01L 41/37* (2013.01)

(58) Field of Classification Search
CPC . G01L 9/08; H01L 41/02; H01L 41/04; H01L 41/113; H01L 41/1132; H01L 41/18; H01L 41/183; H01L 41/22; H01L 41/37
See application file for complete search history.

(56) References Cited

U.S. PATENT DOCUMENTS

| | | | | |
|---|---|---|---|---|
| 2010/0060109 | A1* | 3/2010 | Russell | H01L 41/193 310/363 |
| 2013/0106244 | A1* | 5/2013 | Liu | H01L 41/1132 310/338 |
| 2013/0119689 | A1* | 5/2013 | Nishiwaki | B66C 1/445 294/213 |
| 2013/0134440 | A1* | 5/2013 | Wang | H01L 33/0008 257/76 |
| 2014/0070338 | A1* | 3/2014 | Wang | G06F 3/0414 257/415 |
| 2015/0357374 | A1* | 12/2015 | Wang | H01L 27/20 257/417 |
| 2017/0045406 | A1* | 2/2017 | Jang | G01L 1/16 |

OTHER PUBLICATIONS

Monies, et al., PiezoNEMS: Semiconductor nanowires and heterostructures for sensing and energy harvesting, Semiconductor Conference Dresden-Grenoble (ISCDG), International, pp. 69-74, 2012.

Mei, et al., A case study of mobile robots energy consumption and conservation techniques, in Proc. IEEE Int. Conf on Advanced Robotics (ICAR '05), Seattle, p. 492-497, 2005.

Schmitz, et al., A Tactile sensor for the fingertips of the humanoid robot ICub, In Proc, IEEE/RSJ Int. Conf. on Intelligent Robots and Sytems Taipei, pp. 2212-2217, 2010.

Gao, et al., Electrostatic potential in a bent piezoelectric nanowire, the fundamental theory of nanogenerator and nanopiezotronics, Nano Lett., vol. 7, No. 1, pp. 2499-2505, 2007.

Yang, et al., Power generation with laterally packaged piezoelectric fine wires, Nat. Nanotechnol., vol. 4, pp. 34-39, 2009.

Xu, et al., Self-powered nanowire devices, Nat. Nanotechnol., vol. 5, pp. 366-373, 2010.

Wang, X., Piezoelectric nanogenerators-harvesting ambient mechanical energy at the nanometer scale, Nano Energy, vol. 1, pp. 13-24, 2012.

Shibata., T., An overview of human interactive robots for psychological enrichment, Proc. IEEE, vol. 92, No. 11, pp. 1749-1758, 2004.

Dahiya, et al., Tactile sensing-from humans to humanoids, IEEE Trans. Robot, vol. 26, No. 1, 1-20, 2010.

Nabar, et al., A NEMS vibration energy harvester using ordered piezoelectic ZnO nanowire arrays, in Proc. IEEE Sensors Conf. Taipei, pp. 1-4, 2012.

Nabar, B., Nanostructured Surfaces using thermal nanoimprint lithography: applications in then membrane technology, piezoelectric energy harvesting and tactile pressure sensing, Presented to the Faculty of the Graduate School of the University of Texas, Dec. 2013.

Nabar, et al., Self-Powered, Tactile pressure sensing skin using crystalline ZnO Nanorod arrays for robotic applications, Nanotechnology Research and Education Center and Department of EE, 2013.

Nabar, et al., Self-Powered, Tactile pressure sensors using ordered crystalline ZnO Nanorod on flexible substrates toward robotic skin and garments, IEEE Sensors Journal, vol. 15, No. 1, Jan. 2015.

* cited by examiner

FIG. 12

SELF-POWERED TACTILE PRESSURE SENSORS

CROSS-REFERENCE TO RELATED APPLICATION

This application is the 35 U.S.C. § 371 national stage of, and claims priority to and the benefit of, PCT application PCT/US2014/063201, filed Oct. 30, 2014, which claims priority to and the benefit of U.S. Application No. 61/898,953, filed on Nov. 1, 2013, herein incorporated by reference in their entirety.

NOTICE OF GOVERNMENT-SPONSORED RESEARCH

This invention was made with Government support under grant/contract number IIS-1208623, awarded by the National Science Foundation. The Government has certain rights in the invention.

BACKGROUND

It is frequently desired that a robot, especially one that is involved in human interaction, acquire tactile information from a large area on its surface for safe and effective operation within its environment. As a result, any sensory network on the robot surface should ideally cover a large area, conform to various topographical features on the robot, and provide tactile information to the robot with minimal energy consumption from the robot's limited power resources.

Each sub-system on a robot presents an additional load to the available power resources. To mimic human skin, a robot's sensory network needs to comprise a large area network of tactile sensors. If such a network comprised conventional power-consuming sensors, the network would undesirably add to the power requirements for the robot. It can therefore be appreciated that it would be desirable to have a self-powered sensory network that is suitable for robot applications, as well as other applications.

BRIEF DESCRIPTION OF THE DRAWINGS

The present disclosure may be better understood with reference to the following figures. Matching reference numerals designate corresponding parts throughout the figures, which are not necessarily drawn to scale.

FIGS. 5A and 5B are scanning electron microscope (SEM) images of a patterned template of the type that can be used in the method of FIGS. 4A-4H. FIG. 5A shows the template in plain view, while

FIGS. 6A and 6B are SEM images of ordered ZnO nanorod arrays. FIG. 6A shows the nanorods in plan view, while

DETAILED DESCRIPTION

As described above, it would be desirable to have a self-powered sensory network that can be used in various applications, including robot applications. Disclosed herein are self-powered tactile pressure sensors that can be used in such networks. In some embodiments the sensors incorporate ordered piezoelectric nanorods that are embedded in a flexible material. In some embodiments, the nanorods are grown on a flexible substrate. In some embodiments, the sensors are fabricated using thermal nanoimprint lithography (NIL) and hydrothermal growth to achieve nanoscale ordering of the nanorods.

In the following disclosure, various specific embodiments are described. It is to be understood that those embodiments are example implementations of the disclosed inventions and that alternative embodiments are possible. All such embodiments are intended to fall within the scope of this disclosure.

Disclosed herein are self-powered tactile pressure sensors that do not need an external source of power for transduction of applied pressure into measurable voltage. The primary sensing elements of the sensors are piezoelectric crystalline nanostructures, in the form of nanorods, that generate measurable quantities of charge in proportion to applied mechanical stresses. As will be appreciated from the discussion that follows, advantages of piezoelectric nanorods are higher sensitivity to small forces, mechanical robustness, and improved piezoelectric properties as compared to bulk or thin film materials.

As mentioned above, the disclosed tactile pressure sensors can be used in robot applications. Tactile sensing for robotics dictates that the sensors be positioned on the robot's surface. Robot surfaces are frequently designed to be non-planar in order to accomplish various tasks. In some embodiments, the disclosed sensors are fabricated on flexible polymer substrates that enable a sensor array to be mounted in intimate contact with the robot surface, in a conformal fashion, ensuring that there are no tactile sensing "blind spots." This enables the robot to receive tactile information from all portions of the surface, regardless of its planarity. A low-temperature nanofabrication process has been developed for compatibility with flexible polymer substrates. The process also enables nanoscale nanorods to be seamlessly incorporated into a microscale sensor structure.

In some embodiments, the tactile pressure sensors are fully self-packaged on the flexible polymer substrates so that they can withstand the hazards to which a robot may be subjected, such as dust, moisture, temperature extremes, and mechanical shock. In some embodiments, this is accomplished by embedding the sensor structure in a chemically inert, impervious polymer that is capable of sustaining high temperatures. The packaging process can be built into the sensor fabrication process, resulting in a one-piece tactile pressure sensing "skin" that can be draped over the robot surface or otherwise integrated into another device.

Figure 1:
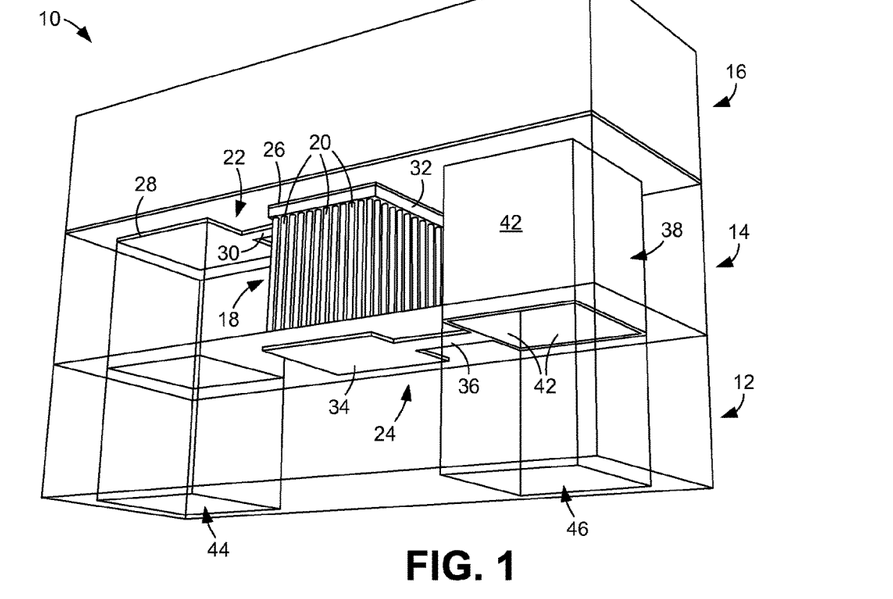
FIG. 1 is a schematic perspective view of an embodiment of a self-powered tactile pressure sensor.
Figure 2:
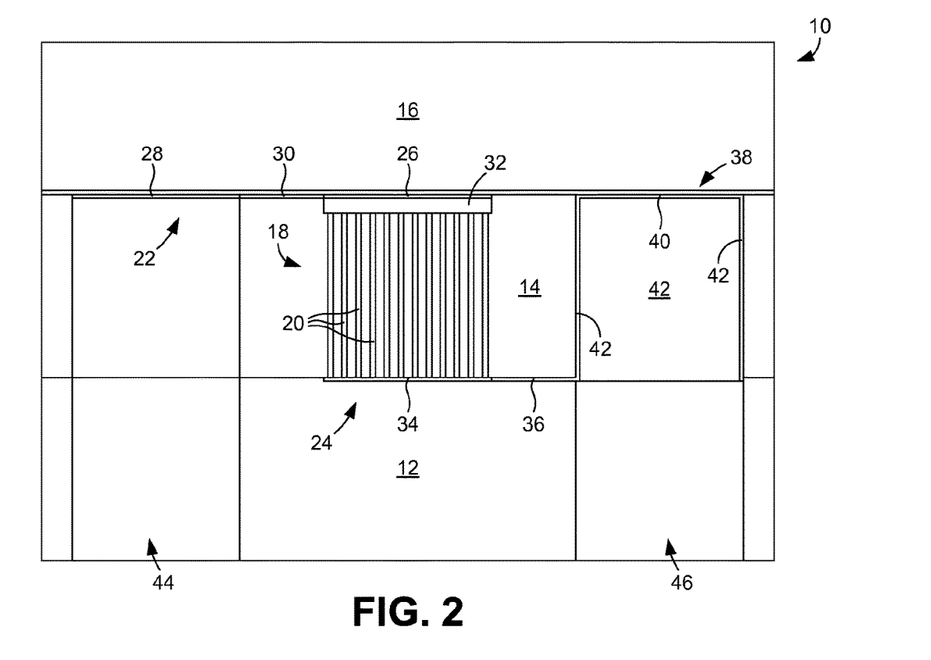
FIG. 2 is a cross-sectional side view of the sensor of FIG. 1.

FIGS. 1 and 2 show an example embodiment of a self-packaged, self-powered, tactile pressure sensor 10. Generally speaking, the sensor 10 comprises a flexible substrate 12, a flexible intermediate layer 14, and a flexible superstrate 16, each of which can be formed, at least in part, from a flexible polymer, such as polyimide, poly(ethylene terephthalate), poly(vinylidene chloride, or polyether(ether ketone). Provided within the intermediate layer 14 is an ordered array 18 of piezoelectric crystalline nanorods 20, which comprise the primary sensing elements of the sensor 10. As is apparent from the figures, the nanorods 20 are generally parallel to each other and are generally perpendicular to both the substrate 12 and the superstrate 16. In some embodiments, the nanorods 20 are embedded in the flexible material (e.g., polyimide) of the intermediate layer 14 such that the material fills the spaces between the nanorods and surrounds each nanorod. Such embedding provides mechanical support to the nanorods 20, as well as moisture and dust resistance. The array 18 of nanorods 20 is said to be "ordered" because, as described below, they are formed using a template having a particular pattern that controls the size, number, position, and spacing of the nanorods. This is in contrast to conventional, randomly grown nanorods used in other applications.

The specific configurations of the nanorods 20 can depend upon the particular application. In the illustrated example, however, the nanorods 20 are arranged in an orthogonal grid configuration in which the nanorods form a generally rectangular footprint and are equally spaced from each other. By way of example, the nanorods 20 can each be approximately 10 to 500 nm in diameter, approximately 100 to 20,000 nm long, and can be spaced with a pitch of approximately 20 to 2,000 nm. In some embodiments, the nanorods 20 are made of zinc oxide (ZnO) and the c-plane of its crystalline structure is parallel to the substrate 12. As a result, when pressure is axially applied to the nanorods 20, they generate a voltage signal with an amplitude proportional to the magnitude of the applied pressure. Accordingly, the nanorods 20 are self-powered and therefore require no external power source.

Electrically coupled to the array 18 of nanorods 20 are a first or top electrode 22 and a second or bottom electrode 24. More particularly, the top electrode 22 is electrically coupled to a top end of each nanorod 20 and the bottom electrode 24 is electrically coupled to a bottom end of each nanorod. As indicated most clearly in FIG. 1, the top electrode 22 can be positioned between the intermediate layer 14 and the superstrate 16 and can comprise a first contact pad 26 that is aligned with (positioned above) the array 18, a second contact pad 28 that is positioned to a side of the array, and a bridge 30 that connects the two pads together. In the illustrated embodiment, each of these components of the top electrode 22 is rectangular.

As is shown in FIGS. 1 and 2, the sensor 10 can comprise a pressure distribution plate 32 that is positioned between the nanorods 20 and the first contact pad 26 of the top electrode 22. When provided, this plate 32 distributes forces transmitted through the superstrate 16 to the array 18 of nanorods 20. In some embodiments, the plate 32 can be made of a metal oxide, such as aluminum oxide ($Al_2O_3$).

In the illustrated example, the bottom electrode 24 also comprises a first contact pad 34 that is aligned with (positioned below) the array 18 and a bridge 30 that extends to and from the pad. In the case of the bottom electrode 24, however, the second contact "pad" is a three-dimensional structure 38 positioned to the side of the array 18 that comprises a top layer 40 (FIG. 2) positioned at the junction of the superstrate 16 and the intermediate layer 14, and four orthogonal walls 42 that extend downward from the top layer through the intermediate layer to the substrate 12. Irrespective of the particular configurations of the electrodes 22, 24, a voltage signal can be extracted from the array 18 of nanorods 20 using the electrodes.

The top electrode 22 can be accessed through a passage 44 that extends through the substrate 12 and the intermediate layer 14 to the second contact pad 28. In similar manner, the bottom electrode 24 can be accessed through a passage 46 that extends through the substrate 12 and the intermediate layer 14 to the top layer 40 of the three-dimensional structure 38.

Figure 3:
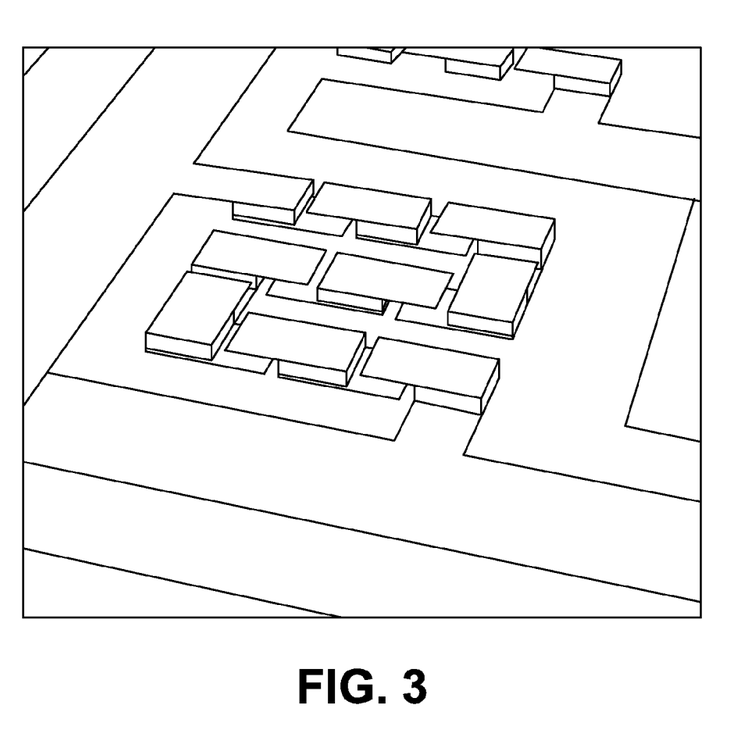
FIG. 3 is a schematic perspective view of multiple self-powered tactile pressure sensors connected in series.

Areas for nanorod growth can be defined using conventional photolithography. Therefore, sensor structures having multiple nanorod arrays, such as those shown in FIGS. 1 and 2, can be electrically connected in series. FIG. 3 shows an example sensor configuration in which multiple arrays are electrically connected in series. Each array in such a scheme can be subjected to the same pressure and generate a voltage signal that can be summed by the series combination.

FIGS. 4A-4H illustrate an example embodiment of a method for fabricating a self-packaged, self-powered, tactile pressure sensor of the type shown in FIGS. 1 and 2. In this example, the sensor is fabricated upside-down, i.e., starting from the superstrate. Beginning with FIG. 4A, a silicon (Si) wafer 50 can be used as a handle wafer upon which layers of the sensor are grown. In some embodiments, the wafer can comprise an SSP silicon wafer.

Figure 4A:
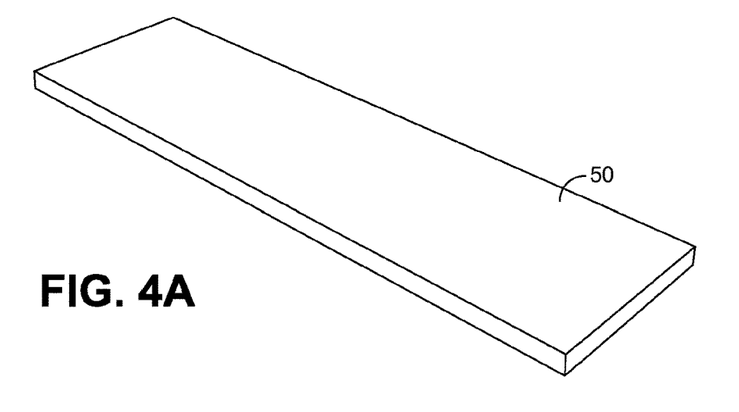
FIGS. 4A-4H are schematic perspective views illustrating sequential stages of an embodiment of a method for fabricating a self-powered tactile pressure sensor.
Figure 4B:
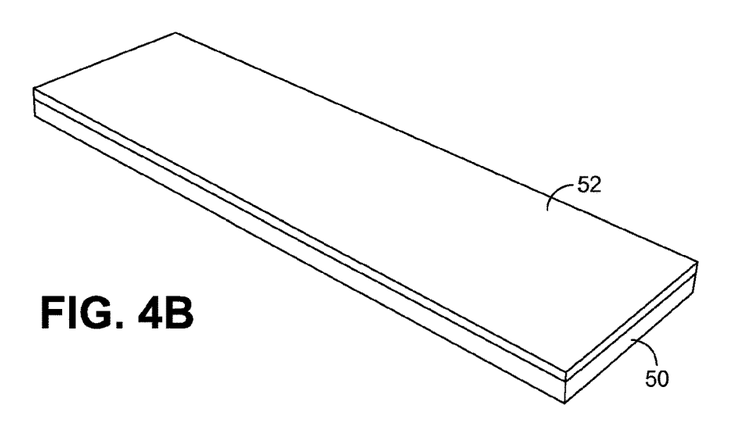

Referring next to FIG. 4B, a thin layer of silicon nitride ($Si_3N_4$) (not identified) can be sputter-deposited on the Si wafer 50 to serve as a planarization and adhesion promoter for the subsequent layers. By way of example, the $Si_3N_4$ layer can be approximately 0.2 µm thick. Next, a superstrate layer 52 can be deposited on top of the $Si_3N_4$. In some embodiments, the superstrate layer 52 can be formed in three steps. First, a first polymer (e.g., polyimide) layer can be spin-coated on the $Si_3N_4$ and cured. By way of example, the polymer layer can be approximately 2 µm thick. Next, a metal oxide (e.g., $Al_2O_3$) layer can be deposited and patterned to form the pressure distribution plate described above. By way of example, the metal oxide layer can be approximately 0.3 µm thick. Finally, a second polymer (e.g., polyimide) layer can be coated onto the existing polymer layer and the metal oxide, and can be cured to complete the fabrication of the superstrate. By way of example, the second polymer layer can be approximately 3 µm thick, such that the superstrate is 5 µm thick.

Figure 4C:
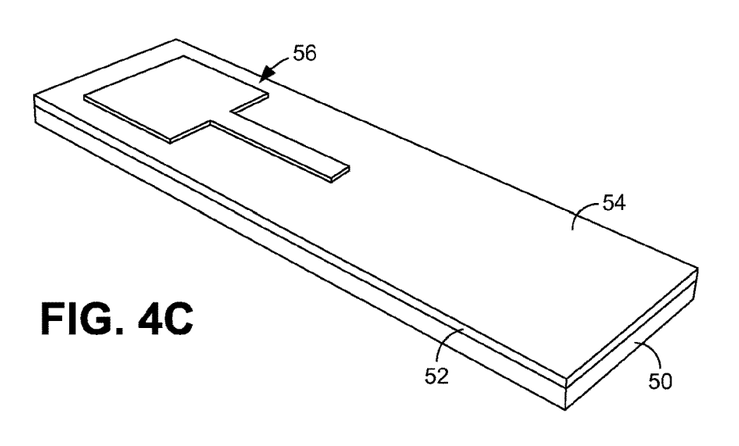

With reference to FIG. 4C, a thin layer 54 of metal (e.g., chromium (Cr)) is deposited on the superstrate 52. By way of example, the layer can be approximately 30 nm thick. Next, a top electrode 56 can be formed on the thin layer 54. In some embodiments, the top electrode 56 is made of gold (Au).

Figure 4D:
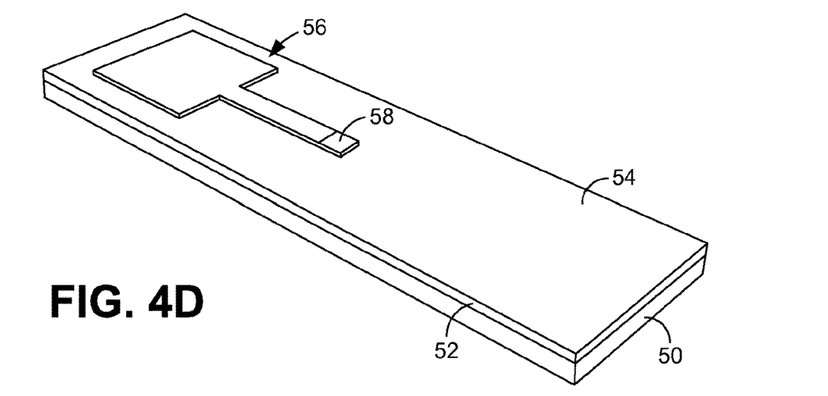

In cases in which the piezoelectric nanorods are to be ZnO nanorods, a ZnO seed layer 58, as shown in FIG. 4D, can be pulsed-laser deposited. The wafer temperature (e.g., 300° C.) and chamber conditions (e.g., 100 mTorr $O_2$) can be optimized for obtaining a polycrystalline c-plane oriented ZnO seed layer.

Figure 5A:
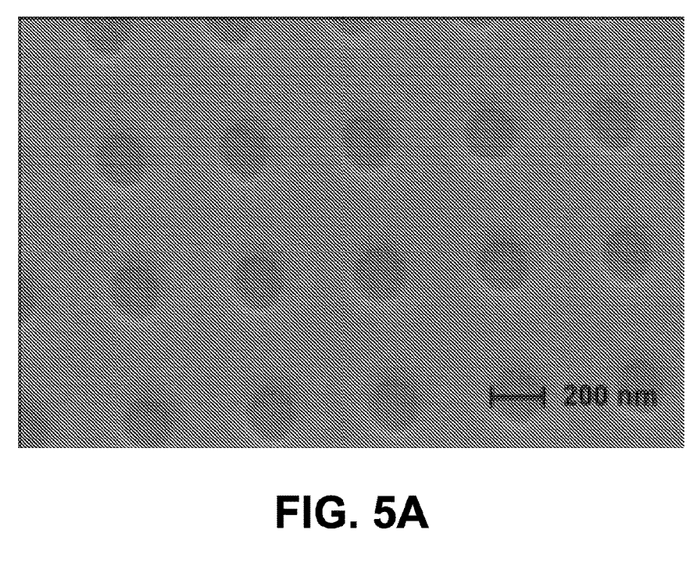
Figure 5B:
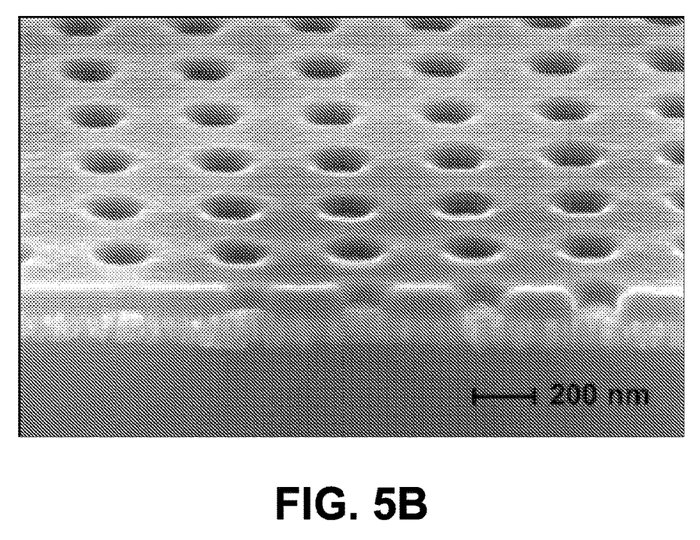
FIG. 5B shows the template in side perspective view as attached to a seed layer.

Once the seed layer 58 has been formed, nanorods can be grown. The growth of the nanorods can be controlled using a patterned template. FIGS. 5A and 5B illustrate an example of such a template. In some embodiments, the ZnO seed layer 58 is coated with a thermoplastic polymer that is patterned using thermal NIL to obtain a patterned template. In the example of FIGS. 5A and 5B, a periodic array of 200 nm diameter, 500 nm pitch circular openings has been formed, which serve as growth sites for the ZnO nanorods.

Figure 4E:
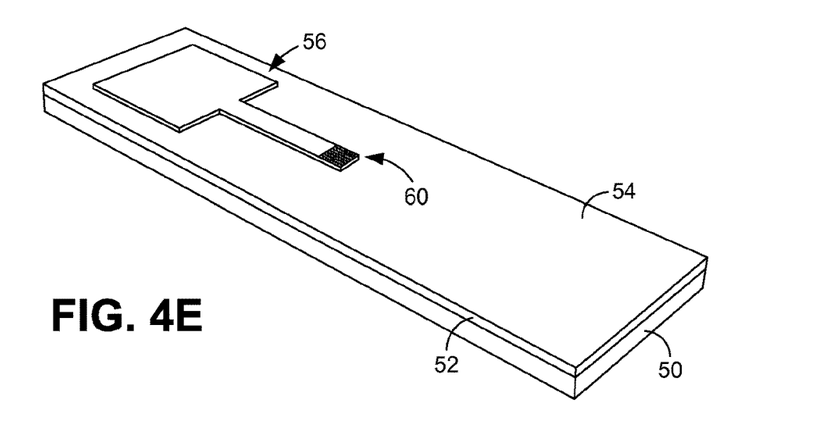
Figure 6A:
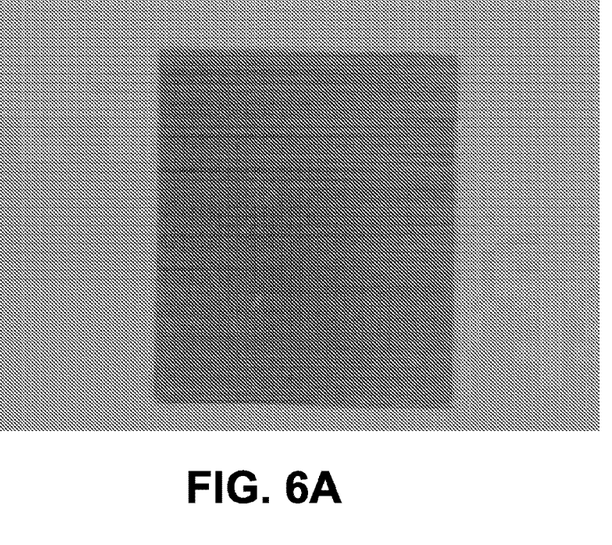
Figure 6B:
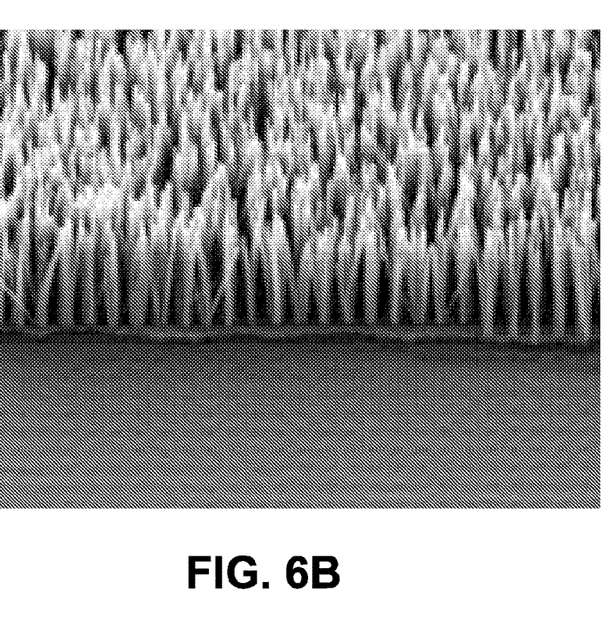
FIG. 6B shows the nanorods in side perspective view.

Referring next to FIG. 4E, crystalline ZnO nanorods 60 can be grown on the portions of the seed layer that are exposed by the openings in the template. The nanorods 60 can be grown using low-temperature hydrothermal growth in an equimolar mixture of zinc acetate and hexamethylenetetramine (HMTA). In some embodiments, the nanorods 60 are grown at a temperature below 300° C. By way of example, the nanorods 60 can be grown at a temperature of approximately 85° C. and a 20 mM mixture can be used. By way of example, the fully-grown nanorods 60 can have an average diameter of approximately 100 nm and an average length of approximately 4 µm. Once the nanorods have been completed, the template can be removed. FIGS. 6A and 6B are scanning electron microscope (SEM) images of an example nanorod array that was grown using the above-described method.

Figure 4F:
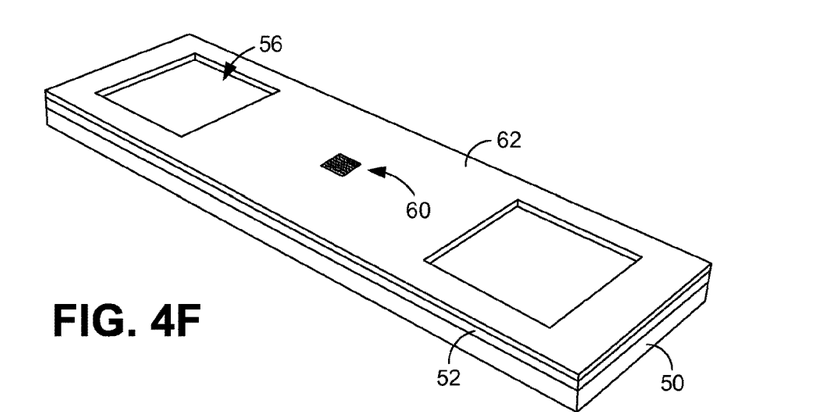

Next, with reference to FIG. 4F, a further polymer (e.g., polyimide) layer 62 can be deposited so as to encase the nanorods 60 in the polymer material for mechanical and environmental protection and to provide support the bottom electrode. The polymer layer 62 can be cured and subjected to an anisotropic oxygen plasma etch to expose the nanorod tips for electrical contact. In some embodiments, the polymer layer can be 5 µm thick.

Figure 4G:
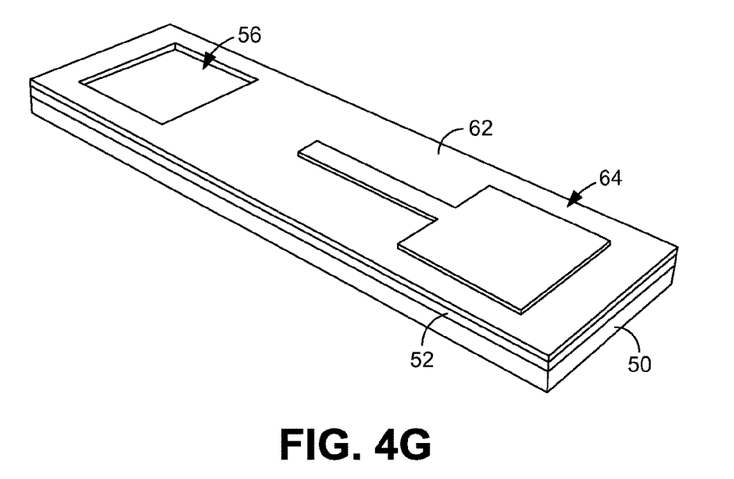

With reference to FIG. 4G, a further thin layer (e.g., 30 nm thick) of metal (e.g., Cr) can be deposited and then the bottom electrode 64 can be deposited and patterned. In some embodiments, the bottom electrode 64 is made of Au.

Figure 4H:
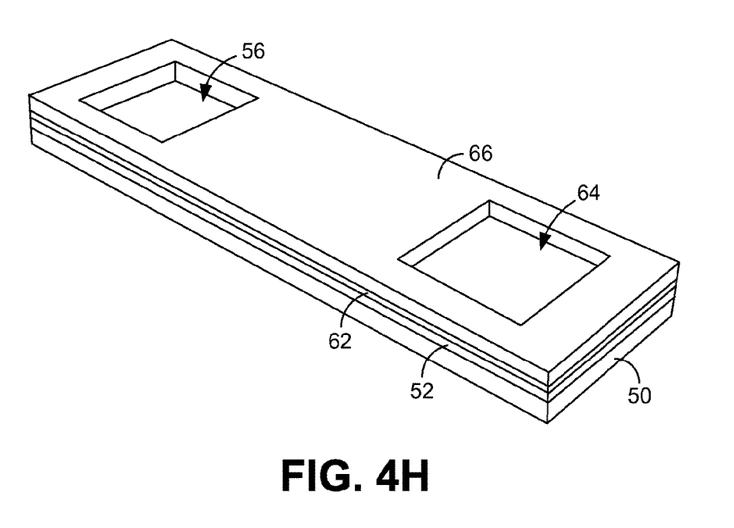

Referring next to FIG. 4H, a further polymer (e.g., polyimide) layer 66 is coated and patterned to complete the substrate and define bondpads. By way of example, the completed substrate can be 60 µm thick.

At this point, the fabricated device can be inverted and subjected to a fluorine-based plasma etch to remove the Si handle wafer 50 to obtain a completed self-powered tactile pressure sensor.

Self-powered tactile pressure sensors similar to those described above were constructed for experimental purposes. Table 1 identifies these sensors. The fabricated sensors were subjected to pressure loading with a custom measurement setup. A micromanipulator station was modified to accept an assembly comprising a 500 µm diameter, laser cut, flat-tipped tungsten probe, a load cell (10 g range, 1 mg. resolution), and a single axis piezoelectric nanopositioner. The assembly was attached to the microscope platform of the micromanipulator station whereby it was possible to translate the assembly with fine motion control in three directions.

TABLE 1

| Tactile Sensor Design Details | | | |
|---|---|---|---|
| Sensor Design Name | Sensor Type | No. of Nanorod Arrays in Series | Dimensions of a Single Nanorod Array |
| TSS | Single | 1 | 500 µm × 500 µm |
| TS9_100 | Series Connected | 9 | 100 µm × 100 µm |
| TS25_50 | Series Connected | 25 | 50 µm × 50 µm |
| TS49_30 | Series Connected | 49 | 30 µm × 30 µm |

In order to evaluate the sensor output with respect to the background noise, such as environmental pick-up, line voltage, and harmonics, the sensor response was first characterized in frequency domain using an Agilent 35670 dynamic signal analyzer. The nanopositioner module was driven using a 50% duty cycle square wave signal from a signal generator. The amplitude of the signal was set such that the tungsten probe applied the desired tactile pressure to the tactile sensor. The load cell displayed the force applied to the tactile sensor in grams from which the applied pressure could be calculated. The tactile sensors were also probed in the time domain. The sensor output was amplified using a SR 560 low-noise amplifier at a gain of 10,000. The output from the amplifier was fed to a Keithley 2182a nanovoltmeter that was continuously sampled.

Figure 7:
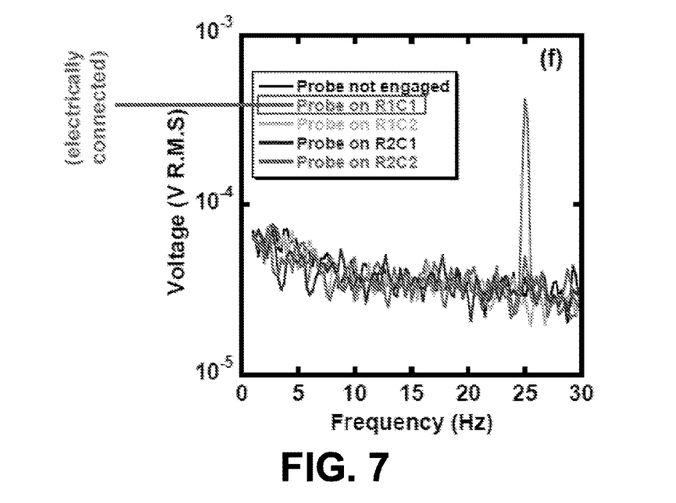
FIG. 7 is a graph that plots signals measured while a fabricated tactile pressure sensor was probed.

As the disclosed sensors are formed on flexible substrates, the question of possible cross-talk between adjacent devices arises. This was evaluated following a systematic procedure. A set of four adjacent TSS-type sensors were probed ("TSS" standing for "touch sensor, single"). Initially, with the pressure-exerting probe lifted, the signal across the device TSS_R1C1 was measured using the signal analyzer. As expected, no voltage spikes were observed. Next, TSS_R1C1 was subjected to a cyclic tactile pressure loading at a frequency of 25 Hz. A corresponding voltage spike was observed on the signal analyzer readout at 25 Hz, thus confirming that the signal originated from the cyclic mechanical compression of the piezoelectric ZnO nanorods in the sensor. Next, with TSS_R1C1 connected across the measurement circuit, the neighboring sensors TSS_R1C2, TSS_R2C1, and TSS_R2C2 were subjected to cyclic tactile pressure loading at 25 Hz. No response was detected on TSS_R1C1, which indicated the complete absence of any cross-talk between adjacent sensors (see FIG. 7). Since the sensor pitch was 1 mm, this test effectively proved that the spatial resolution of the sensor array is 1 mm or better.

Figure 8:
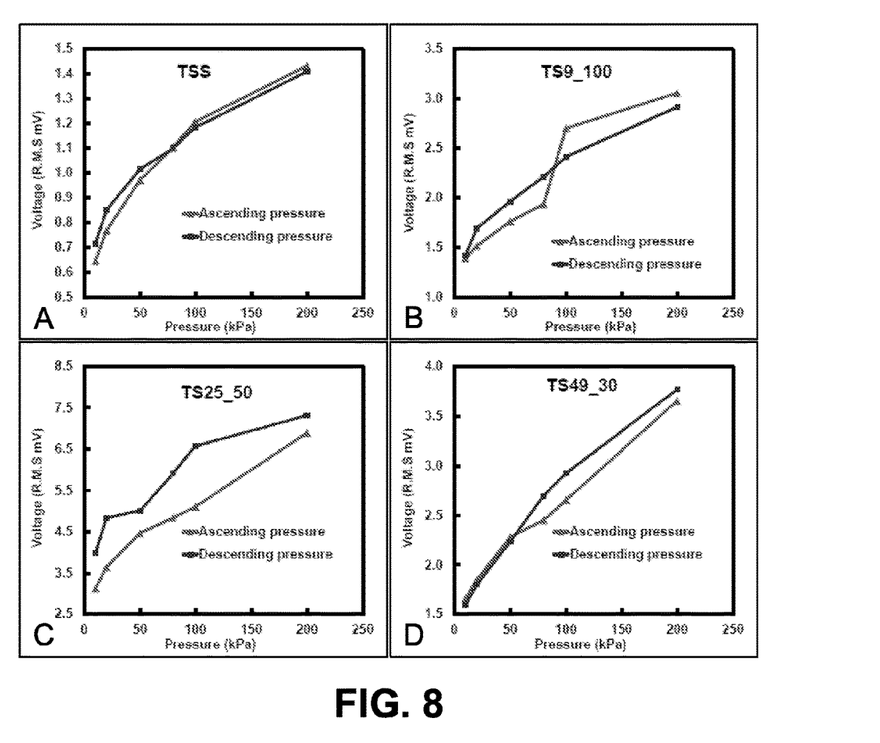
FIGS. 8A-8D are graphs that plot the responses from multiple tactile pressure sensor designs when subjected to a cyclic load in the 10 kPA to 200 kPa range ((A)TSS, (B) TS9_100, (C) TS25_50, and (D) TS49_30).
Figure 9:
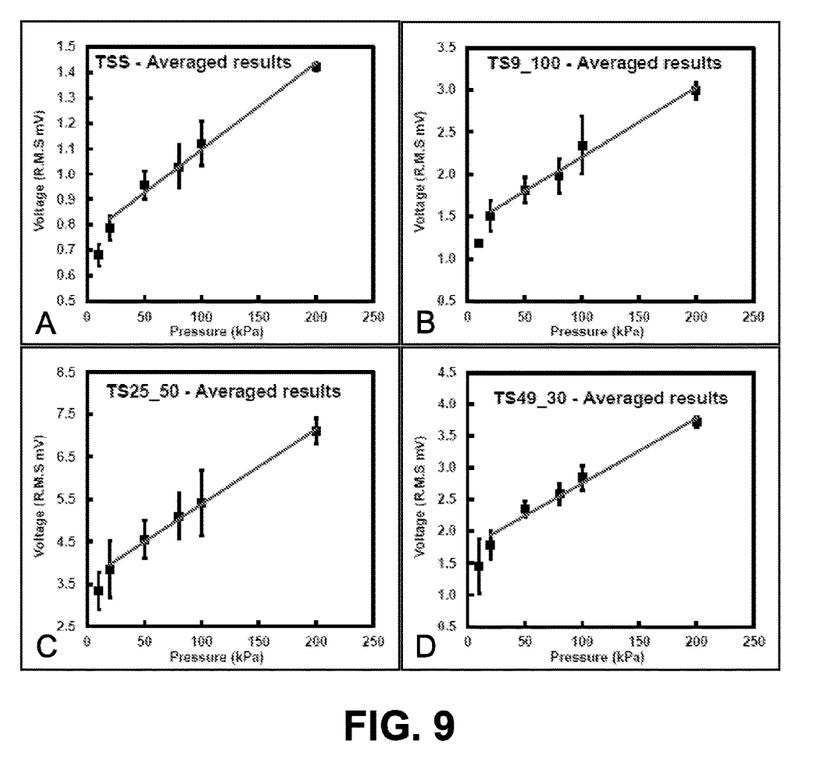
FIGS. 9A-9D are graphs that plot the averaged results from probing the tactile pressure sensor designs at different pressure values multiple times ((A) TSS, (B) TS9_100, (C) TS25_50, and (D)TS49_30).

With the origin of the observed signal verified and any possibility of cross-talk eliminated, the different sensor designs were subjected to cyclic tactile pressure loading in the 10 kPa to 200 kPa range. The applied pressure was increased in six steps and then reduced to check for any hysteresis. Initially, the sensors were probed with a 2 µm substrate polyimide layer. FIG. 8 shows examples of the observed responses from different types of sensors. The pressure voltage characteristic was nearly linear up to 200 kPa and hysteresis was negligible. In general, the hysteresis remained below 10% of the full scale. For pressures below 200 kPa, the sensors survived at least 500,000 taps without any failure.

Figure 10:
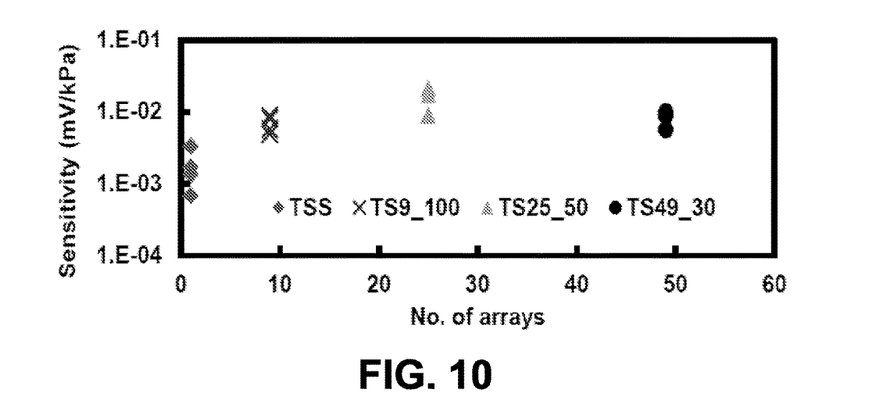
FIG. 10 is a graph that plots the sensitivities of the tactile pressure sensor designs as a function of the number of nanorod arrays in each sensor design. Each data point represents the sensitivity from a single sensor.

The sensors were probed at least four times at each pressure step, and the average generated voltage and standard deviation were noted. The sensor response repeatability was excellent as is evident from the low standard deviation (see FIG. 9). Sensitivity obtained from fourteen different sensors is shown in FIG. 10.

Figure 11:
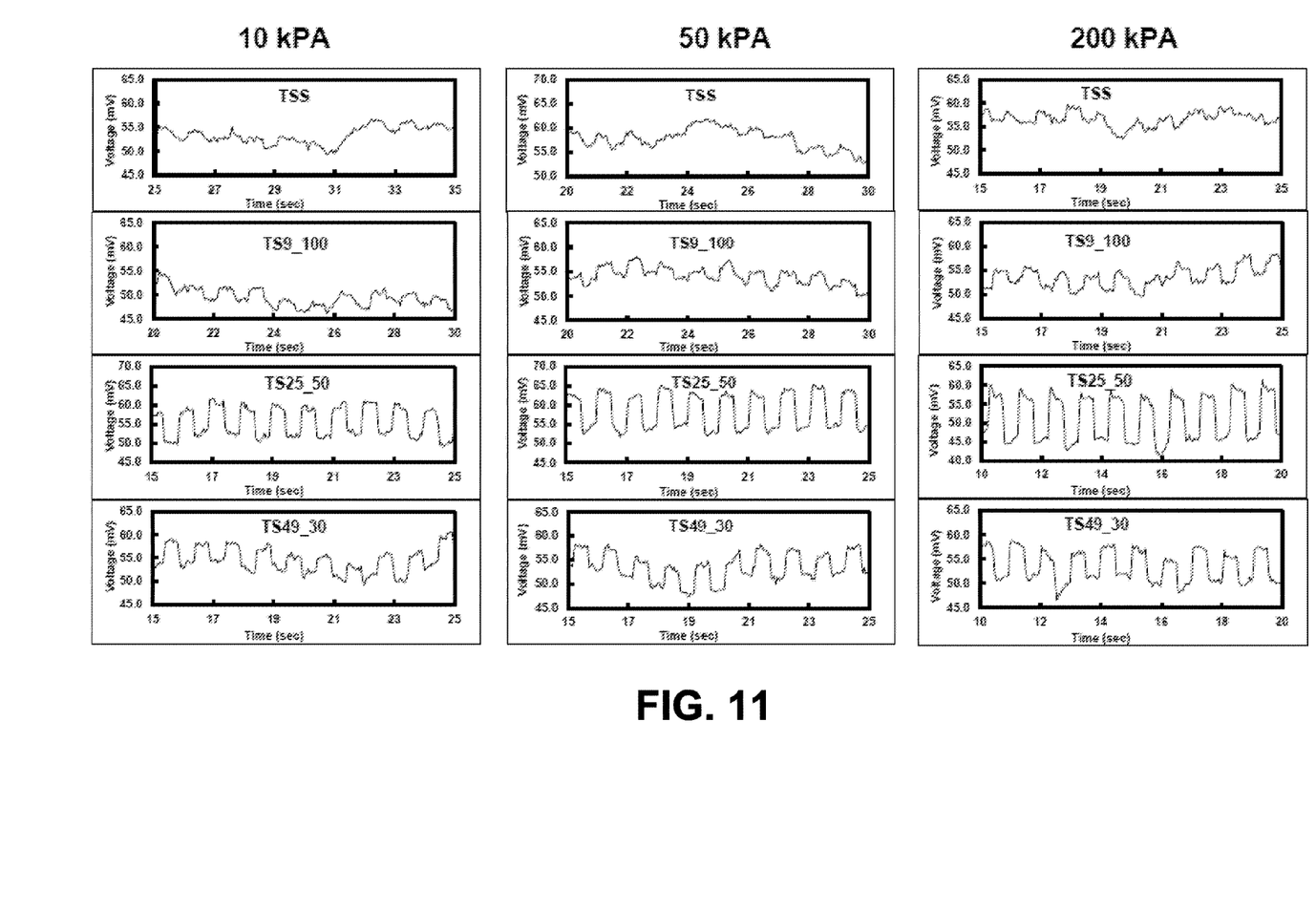
FIG. 11 comprises graphs that plot the time domain responses from the tactile pressure sensor designs in the 10 kPa to 200 kPa pressure range.

The observed sensor response in the time domain mirrors the observation from frequency domain testing (see FIG. 11). For example, in the 50 kPa case, the amplitude of the generated signal increases from approximately 2 mV for the TSS device to approximately 10 mV for the TS25_50 device ("TS" standing for "tactile sensor"). As discussed in above, the voltage generated by each nanorod array in the series connected designs adds up to a higher cumulative voltage for the applied pressure. Therefore, the series-connected sensor designs, namely TS9_100, TS25_50, and TS49_30, generate higher voltage for the same applied pressure than the TSS design. However, the baseline noise for all the sensor designs does not vary appreciably as the noise is dominated by the measurement set-up. This results in a noticeably higher signal to noise ratio, thus allowing more accurate detection of the applied pressure.

It was observed from the frequency domain results as well as the time domain results that the series-connected designs generated higher voltages than the single array design. However, contrary to expectation, it was also observed that the design TS49_30 with 49 series-connected arrays consistently generated lower voltage than the TS25_50 design with 25 series connected arrays. A possible reason for the lower voltage generation from the TS49_30 design lies in the fabrication process; specifically, the fabrication step that involves coating the as-grown ZnO nanorod arrays with a protecting layer of polyimide. After spin coating and curing, the polyimide thickness on top of the larger nanorod arrays (500 μm, 100 μm, and 50 μm) was found to be slightly higher (<1 μm) compared to that on the smallest nanorod arrays (30 μm, used in the TS49_30 design).

This difference in thickness could be attributed to differences in spin coating dynamics of the viscous polyimide as applied to nanorod arrays of different areas. For the same area (~500 μm×500 μm), the TSS, TS9_100 and TS25_50 designs have a higher percentage of the area occupied by nanorods as compared to the TS49_30 design. Consequently, the sensor designs with the larger areas would present a higher resistance to the free flow of polyimide during the spin coating process, resulting in a slightly larger quantity of polyimide being "trapped" between the arrays. This could contribute to a higher thickness of the polyimide in these areas after coating and curing. Conversely, the TS49_30 design has smaller nanorod arrays that would present a comparatively less resistance to the polyimide flow during spin coating which could result in a slightly thinner polyimide layer after coating and curing. The different sensor designs with dissimilar fill polyimide thicknesses were then subjected to a single, uniform plasma etch, to expose the nanorod tips for electrical contact. This transferred the thickness dissimilarities that originated in the coating process to the etch process, resulting in a greater section of the nanorods in the 30 μm array exposed. In comparison, the nanorod tips in the 500, 100, and 50 μm arrays were exposed to a lesser extent. The Ti/Au electrode layer that was subsequently deposited shorted out, the exposed nanorod tips rendering those areas incapable of generating piezoelectric voltage. A larger section of the exposed nanorods in the 30 μm arrays was shorted out, thus reducing the effective nanorod length participating in generation of piezoelectric voltage. As a result, even though the TS49_30 has 49 series connected arrays and does generate higher voltage than the TSS design, the lower effective length of the nanorods in the 30 μm arrays reduces the amplitude of the generated voltage in comparison to the TS25_50 design. This problem could be resolved by optimizing the polyimide plasma etch time to expose the nanorod tips in the 30 μm arrays.

Figure 12:
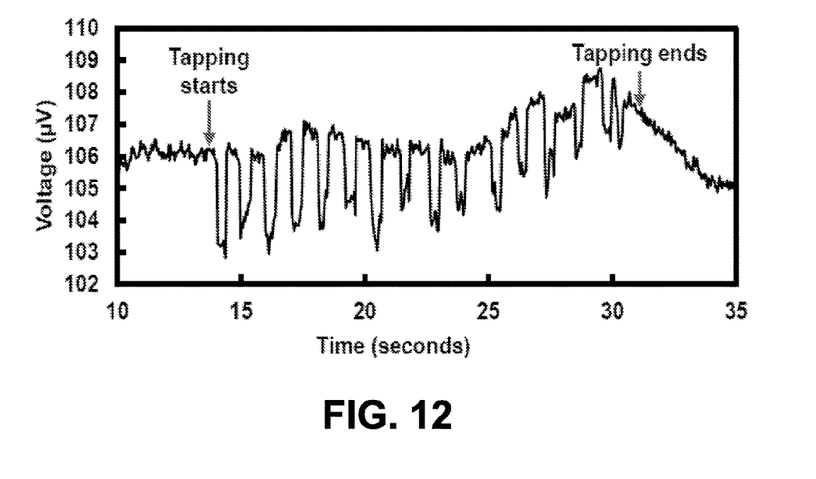
FIG. 12 is a graph that plots the SD16 sensor response after being tapped manually using a hex key.

A single, large area (3.5 mm×3.5 mm) sensor comprising 16 TSS-type arrays connected in series was fabricated to demonstrate the operation of the tactile sensor in response to tactile pressure applied using a common everyday object, as opposed to the precision nanopositioner-load cell setup. Accordingly, a tactile pressure was applied to the device by a human operator holding a hex-key that had a diameter comparable to the area of the sensor. The hex-key was tapped on the sensor at a pressure comparable to that applied when pressing a cell-phone button. The response from the sensor was recorded using in time domain using the measurement apparatus described previously (without the amplifier), and is shown in FIG. 12. Each tap on the sensor with the hex-key corresponds to a negative going pulse on the waveform. As the tapping pressure cannot be controlled precisely in this case, the voltage amplitude varied, in contrast to the case shown in FIG. 11, where the tapping was automatic.

The invention claimed is:

1. A self-powered tactile pressure sensor comprising:
   a flexible polymer substrate;
   a flexible polymer intermediate layer provided on top of the substrate;
   a flexible polymer superstrate provided on top of the intermediate layer, the superstrate having a planar outer surface adapted to contact objects within an environment in which the pressure sensor is used;
   an ordered array of piezoelectric crystalline nanorods embedded within the flexible polymer of the intermediate layer, the nanorods being generally parallel to each other and generally perpendicular to the substrate and the superstrate, each nanorod having a bottom end positioned near the substrate and a top end positioned near the superstrate;
   a top electrode positioned at a junction of the intermediate layer and the superstrate, the top electrode being electrically coupled to the top ends of the nanorods;
   an electrically conductive pressure distribution plate positioned between the top electrode and the top ends of the nanorods, the distribution plate being configured to distribute forces imposed upon the superstrate across the array; and
   a bottom electrode positioned at a junction between the intermediate layer and the substrate, the bottom electrode being electrically coupled to the bottom ends of the nanorods.

2. The sensor of claim 1, wherein each of the substrate, intermediate layer, and the superstrate are made of polyimide.

3. The sensor of claim 1, wherein the nanorods are made of zinc oxide.

4. The sensor of claim 1, wherein a c-plane of each nanorod is generally parallel to the substrate and the superstrate.

5. The sensor of claim 1, wherein the nanorods are approximately 10 to 500 nanometers in diameter.

6. The sensor of claim 5, wherein the nanorods are approximately 100 to 20,000 nanometers long.

7. The sensor of claim 6, wherein the nanorods have a pitch of approximately 20 to 2,000 nanometers.

8. The sensor of claim 1, wherein the pressure distribution plate is made of a metal oxide.

9. The sensor of claim 8, wherein the pressure distribution plate is made of aluminum oxide.

10. The sensor of claim 1, further comprising a first passage formed through the substrate that provides access to the bottom electrode.

11. The sensor of claim 10, further comprising a second passage formed through the substrate and the intermediate layer that provides access to the top electrode.

12. A method for fabricating a self-powered tactile pressure sensor, the method comprising:
    forming a first layer of flexible material that defines an external surface of the pressure sensor;
    forming a thin metal layer on the first layer of flexible material, the metal layer being configured to distribute forces imposed upon the first layer of flexible material;
    forming a first electrode on the thin metal layer;
    forming a seed layer on the first electrode;
    coating the seed layer with a thermoplastic polymer;
    patterning the thermoplastic polymer so as to have a periodic array of openings;
    growing an array of piezoelectric crystalline nanorods on portions of the seed layer exposed through the openings in the template, the nanorods being generally parallel to each other and generally perpendicular to the first layer of flexible material, wherein first ends of the nanorods are electrically coupled to the first electrode;
    removing the thermoplastic polymer;
    forming a second layer of flexible material that embeds the nanorods in the flexible material so as to fill spaces between the nanorods with the flexible material;
    forming a second electrode on the second layer of flexible material, wherein second ends of the nanorods are electrically coupled to the second electrode; and
    forming a third layer of flexible material on the second layer of flexible material.

13. The method of claim 12, wherein patterning the thermoplastic polymer comprises patterning the polymer using thermal nanoimprint lithography.

14. The method of claim 12, wherein growing an array of piezoelectric crystalline nanorods comprises growing the nanorods using low-temperature hydrothermal growth.

15. The method of claim 14, wherein the low-temperature hydrothermal growth is performed at a temperature below 300° C.

16. The method of claim 14, wherein the low-temperature hydrothermal growth is performed at approximately 85° C.

17. The method of claim 12, wherein patterning the thermoplastic polymer comprises patterning the thermoplastic polymer to have a periodic array of 200 nanometer diameter, 500 nanometer pitch circular openings arranged in an orthogonal array.

* * * * *